(12) United States Patent
Sun et al.

(10) Patent No.: US 9,627,421 B2
(45) Date of Patent: Apr. 18, 2017

(54) ARRAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventors: Shuang Sun, Beijing (CN); Seungjin Choi, Beijing (CN); Jing Niu, Beijing (CN); Fangzhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/443,474

(22) PCT Filed: Oct. 1, 2014

(86) PCT No.: PCT/CN2014/088079
§ 371 (c)(1),
(2) Date: May 18, 2015

(87) PCT Pub. No.: WO2015/180357
PCT Pub. Date: Dec. 3, 2015

(65) Prior Publication Data
US 2016/0260754 A1    Sep. 8, 2016

(30) Foreign Application Priority Data

May 29, 2014    (CN) .......................... 2014 1 0234336

(51) Int. Cl.
*H01L 27/12*    (2006.01)
*H01L 27/32*    (2006.01)
(Continued)

(52) U.S. Cl.
CPC ........ *H01L 27/1288* (2013.01); *G02F 1/1368* (2013.01); *G02F 1/13439* (2013.01);
(Continued)

(58) Field of Classification Search
CPC ............. H01L 27/1288; H01L 27/1225; H01L 27/124; H01L 27/127; H01L 27/32;
(Continued)

(56) References Cited

U.S. PATENT DOCUMENTS 8,017,423 B2 * 9/2011 Yoo ................... H01L 29/78603
257/E21.414
8,203,662 B2 * 6/2012 Kang ...................... H01L 27/12
257/60
(Continued)

FOREIGN PATENT DOCUMENTS

| CN | 102254938 A | 11/2011 |
|---|---|---|
| CN | 102832254 A | 12/2012 |
| CN | 103996683 A | 8/2014 |

OTHER PUBLICATIONS

Written Opinion of the International Searching Authority dated Feb. 26, 2015; PCT/CN2014/088079.
(Continued)

*Primary Examiner* — Galina Yushina
(74) *Attorney, Agent, or Firm* — Ladas & Parry LLP

(57) ABSTRACT

An array substrate and manufacturing method thereof and a display device. The display device includes a pixel electrode (8), including a first portion (b) in a non-display region and a second portion (a) in a display region; a first electrode (6) formed on the first portion (b) of the pixel electrode (8); a passivation layer (9) formed on the pixel electrode (8) and the first electrode (6), the passivation layer (9) includes a via hole (11) located over the first electrode (6); an active layer (4) and a second electrode (7) that are formed on the passivation layer (9), the active layer (4) being connected to the first electrode (6) through the via hole (11) of the passivation layer (9). With the array substrate and the manufacturing method thereof, the manufacturing cost is
(Continued)

reduced, materials of the electrodes are less subjected to corrosion, and quality of the array substrate is enhanced.

20 Claims, 7 Drawing Sheets

(51) Int. Cl.
  *G02F 1/1343* (2006.01)
  *H01L 21/77* (2017.01)
  *G02F 1/1333* (2006.01)
  *G02F 1/1368* (2006.01)
  *H01L 29/786* (2006.01)
  *G02F 1/1362* (2006.01)

(52) U.S. Cl.
  CPC .. *G02F 1/133345* (2013.01); *G02F 1/134309* (2013.01); *G02F 1/136286* (2013.01); *H01L 21/77* (2013.01); *H01L 27/12* (2013.01); *H01L 27/124* (2013.01); *H01L 27/127* (2013.01); *H01L 27/1225* (2013.01); *H01L 27/32* (2013.01); *H01L 29/7869* (2013.01); *G02F 1/136227* (2013.01); *G02F 2001/13625* (2013.01); *G02F 2001/136231* (2013.01); *G02F 2001/136236* (2013.01); *G02F 2001/136295* (2013.01)

(58) Field of Classification Search
  CPC ............. H01L 27/3237; H01L 27/3241; H01L 27/3244; H01L 27/3248; H01L 29/7869; H01L 2021/775; H01L 27/1214; G02F 1/1368; G02F 1/134309; G02F 1/133345; G02F 1/13439; G02F 1/136236; G02F 2001/134318; G02F 2001/135295; G02F 2001/13626
  See application file for complete search history.

(56) References Cited

U.S. PATENT DOCUMENTS

| | | | |
|---|---|---|---|
| 8,901,565 B2 * | 12/2014 | Lan | H01L 27/1214 257/329 |
| 2006/0175609 A1 * | 8/2006 | Chan | H01L 29/66787 257/59 |
| 2006/0216843 A1 | 9/2006 | Kim | |
| 2011/0096270 A1 | 4/2011 | Ahn et al. | |
| 2012/0140153 A1 * | 6/2012 | Kawashima | G02F 1/133707 349/96 |
| 2014/0138685 A1 * | 5/2014 | Zhang | H01L 22/32 257/48 |

OTHER PUBLICATIONS

International Search Report mailed Apr. 3, 2015; PCT/CN2014/088079.

* cited by examiner

ARRAY SUBSTRATE AND METHOD FOR MANUFACTURING THE SAME, AND DISPLAY DEVICE

TECHNICAL FIELD

Embodiments of the present invention relate to an array substrate and a method for manufacturing the same, and a display device.

BACKGROUND

Thin Film Transistor Liquid Crystal Displays (TFT-LCDs) attract a lot of attentions because they have the traits of small volume, low power consumption, irradiation-free, etc. They play a leading role in the field of flat panel display, and have been widely applied to all trades and professions.

TFT-LCDs can be classified into those of a vertical electric field type and those of a horizontal electric field type based on the direction of an electric field for driving liquid crystals. The vertical electric field type includes twisted nematic mode, and the horizontal electric field type includes an Advanced Super Dimension Switch (ADS) mode and an In-Plane Switching (IPS) mode. Horizontal electric field mode TFT-LCDs, especially ADS mode TFT-LCDs, have the merits of wide viewing angle, high aperture ratio and so on and have been widely applied. In particular, high transmittance-Advanced Super Dimension Switch (HADS) mode TFT-LCDs have been paid more and more attention.

SUMMARY

According to at least one embodiment of the present invention, there are provided an array substrate and manufacturing method thereof, and a display device, for solving the technical issue that a TFT-LCD array substrate has a cumbersome manufacturing process and a relatively high cost, and a conductive material for a source/drain layer tends to be corroded during manufacture in prior art.

According to at least one embodiment of the invention, there is provided array substrate, which includes a pixel electrode, including a first portion located in a non-display region of the array substrate and a second portion located in a display region of the array substrate; a first electrode formed on the first portion of the pixel electrode; a passivation layer formed on the pixel electrode and the first electrode, which includes a via hole located over the first electrode; an active layer and a second electrode that are formed on the passivation layer, the active layer being connected to the first electrode through the via hole of the passivation layer.

According to at least one embodiment of the invention, there is further provided a display device, which includes the array substrate as stated in any of above items.

According to at least one embodiment of the invention, there is further provided a manufacturing method of an array substrate, which includes forming a pattern that includes a pixel electrode and a first electrode, the pixel electrode including a first portion located in a non-display region of the array substrate and a second portion located in a display region of the array substrate, the first electrode being located on the first portion of the pixel electrode;

forming a pattern of a passivation layer on the pixel electrode and the first electrode, the passivation layer including a via hole located over the first electrode;

forming a pattern that includes an active layer and a second electrode on the passivation layer, the active layer being connected to the first electrode through the via hole of the passivation layer.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
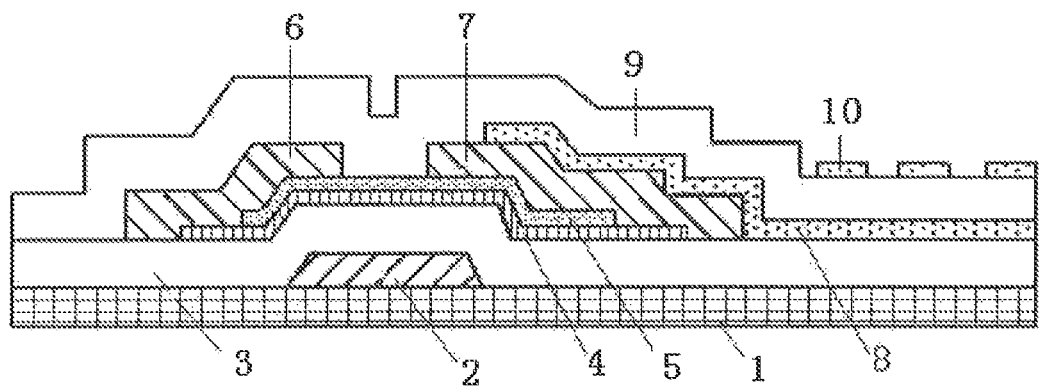
FIG. 1 is a structurally schematic view illustrating a HADS mode TFT-LCD array substrate.

In the fabricating process of manufacturing a HADS mode TFT-LCD array substrate, the number of patterning processes is relatively larger, and for example, six patterning processes are usually adopted in the mass production. FIG. 1 is a structurally schematic view illustrating a HADS mode TFT-LCD array substrate. As for the structure of an array substrate illustrated in FIG. 1, during manufacture, a pattern of a gate electrode 2 and a gate line 2 is formed on a glass substrate 1 by a first patterning process; a gate insulating layer 3 is deposited; a pattern of an active layer 4 is formed by a second patterning process; a pattern of a data line 6, a source electrode 6, a drain electrode 7 and a TFT channel is formed by a third patterning process; a pattern of a pixel electrode 8 is formed by a fourth patterning process; a pattern of a passivation layer 9 is formed by a fifth patterning process; and a pattern of a common electrode 10 is formed by a sixth patterning process. In case that a metal oxide is used for the active layer 4, for the sake of protecting the metal oxide from being affected by the external environment, an etch barrier layer 5 still has to be formed generally after the active layer 4 is formed and before the source electrode 6 and the drain electrode 7 are formed, and then, one patterning process may be added. Therefore, the use number of mask is relatively larger, and the cost is relatively higher.

In addition, for the sake of lessening the signal delay, the conductive material for a source/drain layer of the TFT-LCD usually employs a low-resistance material (e.g. copper). In the HADS technology, as is usually the case, a patterning process of the pixel electrode 8 is carried out after the source electrode 6 and the drain electrode 7 are finished by manufacture, but if the pixel electrode 8 is fabricated by using ITO, an etching solution for ITO (indium tin oxide) will contact and have corrosive effects on copper. Thus, electrical characteristics of a copper electrode are degraded.

Figure 2:
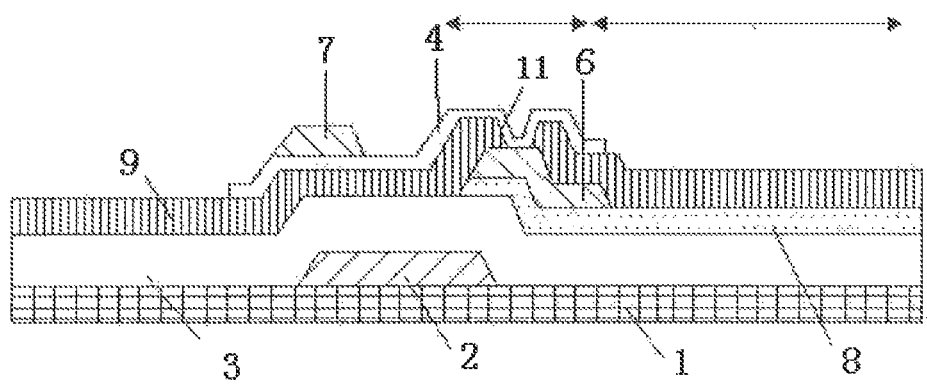
FIG. 2 is a schematic view illustrating the basic structure of an array substrate according to an embodiment of the invention.

According to at least one embodiment of the invention, there is provided an array substrate. Referring to FIG. 2, it includes a pixel electrode 8, which includes a first portion b located in a non-display region of the array substrate and a second portion a located in a display region of the array substrate; a first electrode 6 formed on the first portion b of the pixel electrode 8; a passivation layer 9 formed on the pixel electrode 8 and the first electrode 6, which includes a via hole 11 located over the first electrode 6; an active layer 4 and a second electrode 7 that are formed on the passivation layer 9, the active layer 4 being connected to the first electrode 6 through the via hole 11 of the passivation layer 9.

In at least one embodiment of the invention, the array substrate may further include a common electrode 10 (see FIG. 3), which is located on the passivation layer 9, and which is formed by a portion of the active layer 4 located in the display region subjected to a plasma treatment, and takes the form of a slit.

In at least one embodiment of the invention, the array substrate may further include an etch barrier layer 5 formed on the active layer 4 and the second electrode 7.

Figure 3:
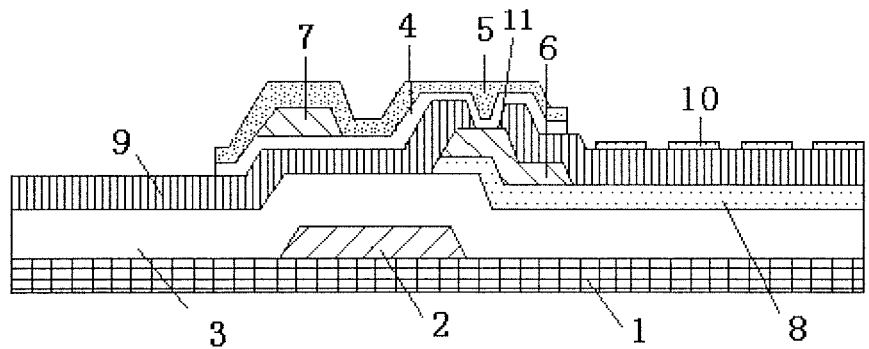
FIG. 3 is a structurally schematic view illustrating an array substrate according to another embodiment of the invention.

In at least one embodiment of the invention, the array substrate may be a top-gate structure, and may also be a bottom-gate structure. For example, when the array substrate in the present embodiment is a bottom-gate structure, as illustrated in FIGS. 2 and 3, the array substrate may further include a gate electrode 2 and a gate line 2 that are formed on a glass substrate 1, and a gate insulating layer 3 formed on the gate electrode 2 and the gate line 2, with a pixel electrode 8 being formed on the gate insulating layer 3.

In at least one embodiment of the invention, the first electrode 6 and the second electrode 7 may be a source electrode and a drain electrode, respectively.

In at least one embodiment of the invention, material for the gate electrode 2, the first electrode 6 and the second electrode 7 may be copper or a copper alloy, so as to lessen the signal delay of the array substrate.

In at least one embodiment of the invention, the second electrode 7 may not overlap with the first electrode 6.

According to at least one embodiment of the invention, there is further provided a display device, which includes the array substrate as stated in any of the above items.

Figure 4:
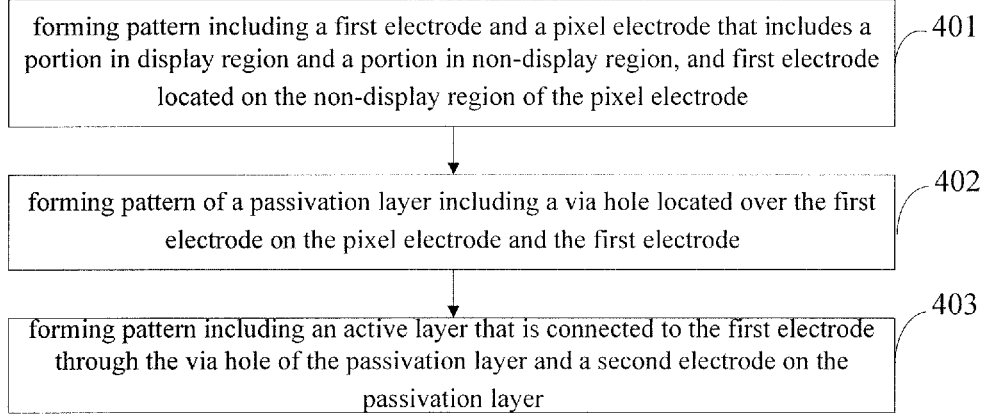
FIG. 4 is a schematically basic flowchart illustrating the manufacturing method of an array substrate according to an embodiment of the invention.

According to at least one embodiment of the invention, there is further provided a manufacturing method of an array substrate. Referring to FIG. 4, it includes:

Step 401: a pattern including a pixel electrode and a first electrode is formed, the pixel electrode includes a first portion located in a non-display region of the array substrate and a second portion located in a display region of the array substrate, and the first electrode is located on the first portion of the pixel electrode.

Step 402: a pattern of a passivation layer is formed on the pixel electrode and the first electrode, the passivation layer includes a via hole located over the first electrode.

Step 403: a pattern including an active layer and a second electrode is formed on the passivation layer, the active layer is connected to the first electrode through the via hole of the passivation layer.

In at least one embodiment of the invention, the manufacturing method may further include that, a plasma treatment is conducted on a portion of the active layer located in the display region to metalize it, so that a common electrode is formed.

In at least one embodiment of the invention, the manufacturing method may further include that, a pattern of an etch barrier layer is formed on the active layer and the second electrode.

In at least one embodiment of the invention, the manufacturing method may further include that, a pattern that includes a gate electrode and a gate line is formed on a glass substrate, a pattern of a gate insulating layer is formed on the gate electrode and the gate line, and a pixel electrode is formed on the gate insulating layer.

Figure 11:
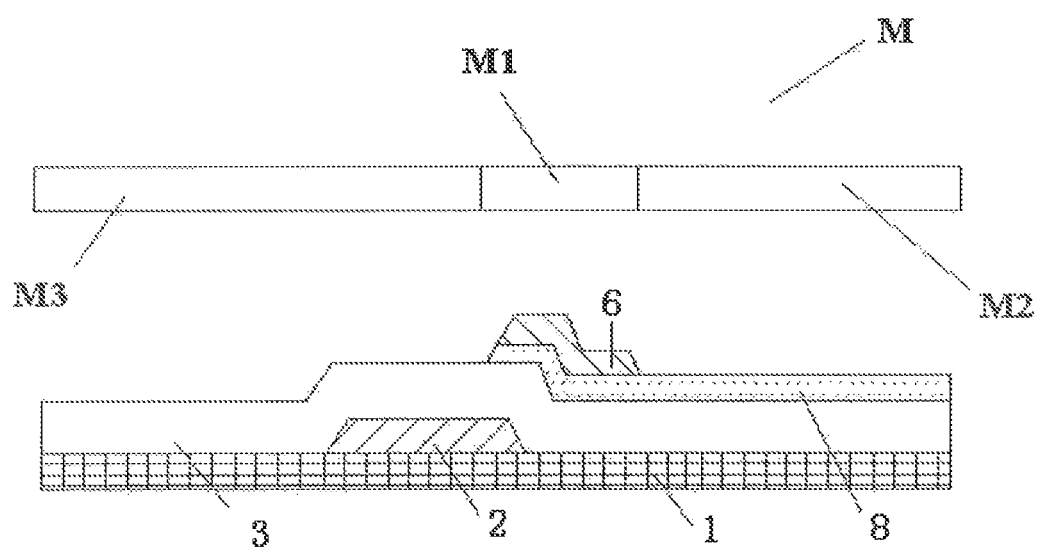
FIG. 11 is a schematic view illustrating a grey-tone mask M used in the manufacturing method in FIG. 5, including regions M1, M2 and M3.

For example, in an example, it is possible that a pattern including the pixel electrode and the first electrode is formed by one exposure and development of photoresist and two etchings, and steps for it may be that, a transparent conductive layer thin film and a first electrode layer thin film are formed sequentially;

a first photoresist is coated on the first electrode layer thin film and is exposed and developed with a gray-tone mask M as illustrated in FIG. 11 including regions M1, M2 and M3, so as to form a first photoresist fully-retained region (from the region M1) in correspondence with a zone where the first electrode is to be formed, a first photoresist half-retained region (from the region M2) in correspondence with a zone where a portion of the pixel electrode in a display region is to be formed, and a first photoresist fully-removed region (from the region M3) in correspondence with other zone than those stated above;

a first etching is conducted, so that the first electrode layer thin film and the transparent conductive layer thin film at the first photoresist fully-removed region are etched off, an ashing treatment is performed on the first photoresist, so that the photoresist at the first photoresist fully-retained region is thinned, and the photoresist at the first photoresist half-retained region is fully removed, and then a second etching is conducted, so that the first electrode layer thin film at the first photoresist half-retained region is etched off.

The photoresist is removed, so that a pattern including the pixel electrode and the first electrode is formed.

For example, in another example, it is also possible that a pattern including an active layer, a second electrode and a data line is formed by one exposure and development of photoresist and two etchings, and steps for it may be that, an active layer thin film and a second electrode layer thin film are formed on a passivation layer sequentially, wherein the active layer film forms a portion of the active layer located in the non-display region;

after a second photoresist is coated on the second electrode layer thin film and is exposed and developed with a gray-tone mask, a second photoresist fully-retained region in correspondence with a second electrode zone and a data line zone that are to be formed, a second photoresist half-retained region in correspondence with an active layer zone to be formed, and a second photoresist fully-removed region in correspondence with other zone than those stated above are formed, wherein the above-mentioned active layer zone may include a portion in which a common electrode is to be formed;

a first etching is conducted, so that the second electrode layer thin film and the active layer thin film at the second photoresist fully-removed region are etched off, an ashing treatment is performed on the second photoresist, so that the photoresist at the second photoresist fully-retained region is thinned, and the photoresist at the second photoresist half-retained region is fully removed, and then a second etching is conducted, so that the second electrode layer thin film at the second photoresist half-retained region is etched off;

the photoresist is removed, so that a pattern including the second electrode, the data line and the active layer is formed, and at this time, the active layer also includes a zone where a common electrode is to be formed. This part of the region may be metalized by a subsequent plasmas treatment to be directly formed into the common electrode, so as to decrease the manufacturing steps.

In at least one embodiment of the invention, the first electrode and the second electrode may be a source electrode and a drain electrode, respectively.

In at least one embodiment of the invention, material for the gate electrode, the first electrode and the second electrode may be copper or a copper alloy, so as to lessen the signal delay of the array substrate.

In at least one embodiment of the invention, the second electrode may not overlap with the first electrode.

Embodiment 1

Figure 5:
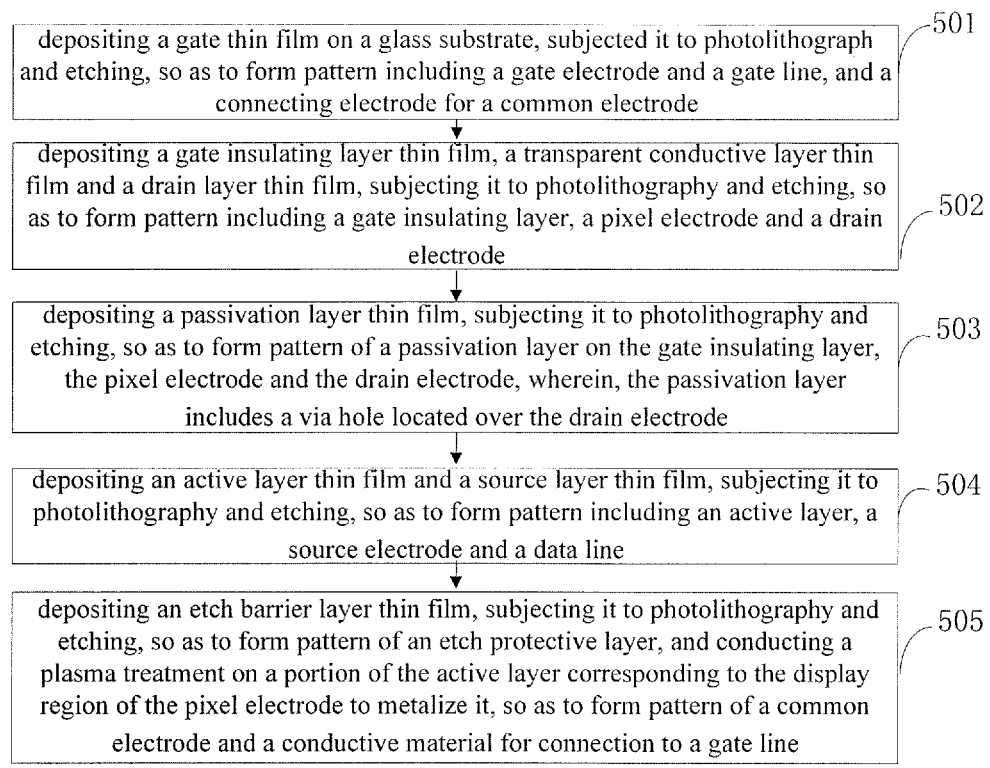
FIG. 5 is a schematic flowchart illustrating the manufacturing method of an array substrate according to embodiment 1 of the invention.

According to Embodiment 1 of the invention, there is provided a manufacturing method of a TFT-LCD array substrate, for describing the specific implementing procedure of an embodiment of the invention in detail. Please refer to FIG. 5.

Step 501, a gate thin film is deposited on a glass substrate, and is subjected to photolithography and etching, so as to form a pattern including a gate electrode and a gate line, and a connecting electrode for a common electrode.

Figure 6:
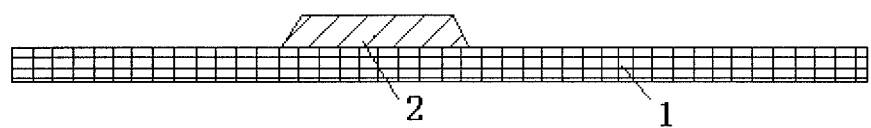
FIG. 6 is a schematic view illustrating the structure formed after a first photolithography and etching in embodiment 1 of the invention.

In this step, material for the deposited gate thin film is copper. The gate thin film of the glass substrate 1 is subjected to exposure and development with a normal mask, and then etched, so as to form a pattern of a gate electrode 2 and a gate line 2, and a connecting electrode for a common electrode 10. See FIG. 6.

Step 502, a gate insulating layer thin film, a transparent conductive layer thin film and a drain layer thin film are deposited, and subjected to photolithography and etching, so as to form a pattern that includes a gate insulating layer, a pixel electrode and a drain electrode.

In this step, firstly, the gate insulating layer thin film, the transparent conductive layer thin film and the drain electrode layer thin film are deposited specifically. For example, material used for the gate insulating layer thin film is SiNx, material used for the transparent conductive layer thin film is ITO, and material used for the drain layer thin film is copper.

After a first photoresist is coated on the drain layer thin film and is exposed and developed with a gray-tone mask, a first photoresist fully-retained region, a first photoresist half-retained region and a first photoresist fully-removed region are formed, wherein, the first photoresist fully-retained region corresponds to a drain electrode zone to be formed, corresponding to a non-display region of the pixel electrode, the first photoresist half-retained region corresponds to a zone where a portion of the pixel electrode in a display region is to be formed, and the first photoresist fully-removed region corresponds to other zone than those stated above.

A first etching is conducted, so that the drain layer thin film and the transparent conductive layer thin film at the first photoresist fully-removed region are etched off, an ashing treatment is performed on the first photoresist, so that the photoresist at the first photoresist fully-retained region is thinned, and the photoresist at the first photoresist half-retained region is fully removed, and then a second etching is conducted, so that the drain layer thin film at the first photoresist half-retained region is etched off.

Figure 7:
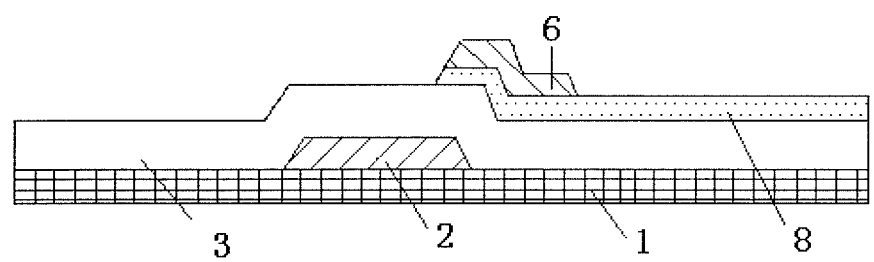
FIG. 7 is a schematic view illustrating the structure formed after a second photolithography and etching in embodiment 1 of the invention.

Finally, the photoresist is removed, so as to form a pattern including a gate insulating layer 3, a pixel electrode 8 and a drain electrode 6. See FIG. 7.

Step 503: a passivation layer thin film is deposited, and is subjected to photolithography and etching, so as to form a pattern of a passivation layer on the gate insulating layer, the pixel electrode and the drain electrode, wherein the passivation layer includes a via hole located over the drain electrode.

In this step, the passivation layer thin film is deposited firstly, and for example, the used material is SiNx. Next, photolithography and etching are conducted with a common mask, so as to form a pattern of a passivation layer 9.

Figure 8:
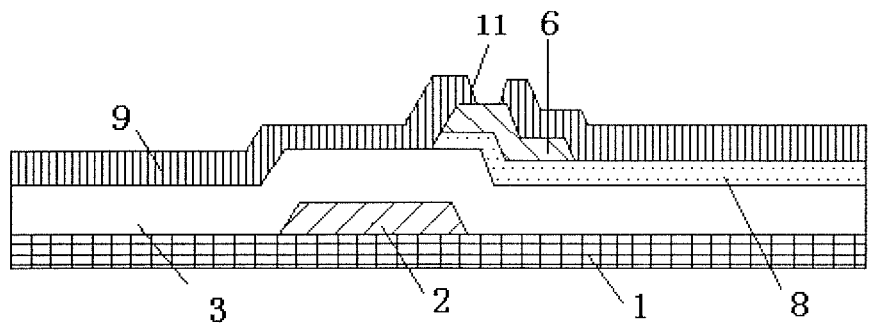
FIG. 8 is a schematic view illustrating the structure formed after a third photolithography and etching in embodiment 1 of the invention.

The passivation layer 9 includes a via hole 11, which lies over the drain electrode 6, and corresponds to the contact position between the active layer 4 and the drain electrode 6, interface position of a gate line 2, and the connection position between the common electrode 10 and the connecting electrode. See FIG. 8.

Step 504: an active layer thin film and a source layer thin film are deposited, and subjected to photolithography and etching, so as to form a pattern including an active layer, a source electrode and a data line.

In this step, firstly, the active layer thin film and the source layer thin film are deposited respectively, material used for the active layer thin film is IGZO, and material for the source layer thin film is copper.

After a second photoresist is coated on the source layer thin film and is exposed and developed with a gray-tone mask, a second photoresist fully-retained region, a second photoresist half-retained region and a second photoresist fully-removed region are formed, wherein, the second photoresist fully-retained region corresponds to a source electrode zone and a data line zone that are to be formed. In the embodiment, the source electrode does not overlap with the drain electrode, and in other embodiment of the invention, a source electrode may overlap with a drain electrode as well. The second photoresist half-retained region corresponds to an active layer zone to be formed, and the active layer zone here also includes a zone where a common electrode and a gate-line interface are to be formed, corresponding to a display region of the array substrate. The second photoresist fully-removed region corresponds to other zone than those stated above.

A first etching is conducted, so that the source layer thin film and the active layer thin film at the second photoresist fully-removed region are etched off, an ashing treatment is performed on the second photoresist, so that the photoresist at the second photoresist fully-retained region is thinned, and the photoresist at the second photoresist half-retained region is fully removed, and then a second etching is conducted, so that the source layer thin film at the second photoresist half-retained region is etched off.

Figure 9:
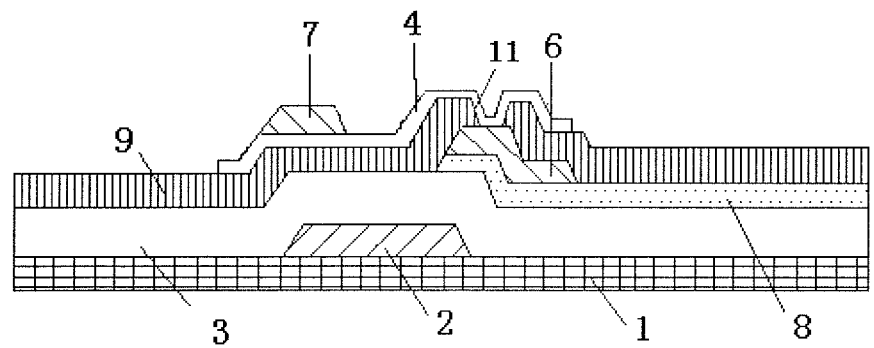
FIG. 9 is a schematic view illustrating the structure formed after a fourth photolithography and etching in embodiment 1 of the invention.

The photoresist is removed, so as to form a pattern including a source electrode 7 and an active layer 4, wherein the source electrode 7 is connected to the data line 6, and the active layer 4 is connected to the drain electrode 6 through the via hole 11. See FIG. 9.

Step 505: an etch barrier layer thin film is deposited, and subjected to photolithography and etching, so as to form a pattern of an etch barrier layer, and a portion of the active layer in correspondence with the display region of the pixel electrode is subjected to plasma treatment to metalize it, so that a pattern of a common electrode and a conductive material for connection to a gate line are formed.

In this step, for example, material for the etch barrier layer thin film is $SiO_2$, and after deposition of the etch barrier layer thin film, it is subjected to photolithography and etching with a normal mask, so as to form a pattern of an etch barrier layer 5. Next, an IGZO active-layer material that is exposed at the surface and situated in a common electrode zone to be formed is subjected to plasma treatment to metalize it, so that a pattern of the common electrode 10 and a conductive material for connection to a gate line lying in a via hole for gate-line interface are formed. The finally formed array substrate is illustrated in FIG. 3.

Up to here, the whole course of the manufacturing method of the HADS mode TFT-LCD array substrate according to embodiments of the invention is accomplished.

As can be seen, the above embodiments of the invention at least have the following beneficial effects.

In the array substrate and manufacturing method thereof and the display device according to embodiments of the invention, a first electrode and a second electrode serving as a source electrode and a drain electrode are formed above an ITO material as a pixel electrode, and thus, when the ITO material is etched, the vast majority of surface of the conductive material is covered by a photoresist for protection. By doing this, the conductive material is avoided from contacting with an etching solution for the ITO material, and corrosive effect of the etching solution on the conductive material is greatly reduced. Therefore, the quality of the array substrate is enhanced.

Furthermore, in the array substrate and manufacturing method thereof and the display device provided by the invention, only five mask processes are required to produce the TFT-LCD array substrate, thereby saving the manufacturing time, and reducing the manufacturing cost.

Figure 10:
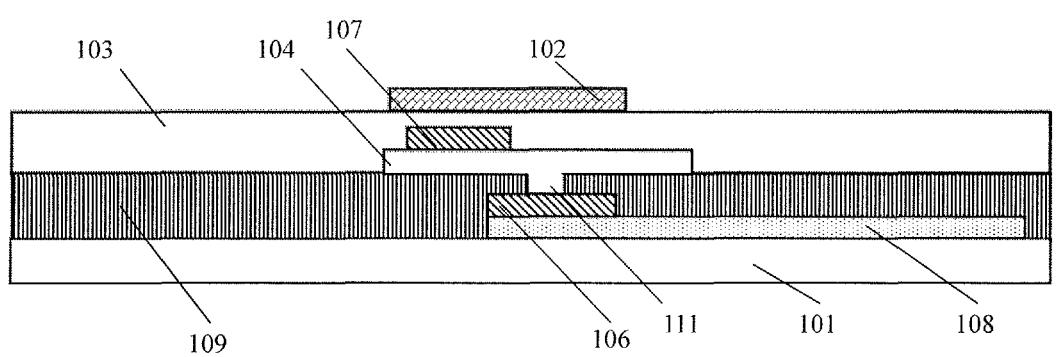
FIG. 10 is a structurally schematic view illustrating an array substrate according to another embodiment of the invention.

FIG. 10 illustrates the structure of an array substrate provided by at least one embodiment of the invention. The array substrate is of a top-gate type, and it includes a glass substrate 101 and a pixel electrode 108 formed over the glass substrate 101, and the pixel electrode 8 also includes a first portion located in a non-display region of the array substrate and a second portion located in a display region of the array substrate. A first electrode 106 is formed on the first portion of the pixel electrode 108, a passivation layer 109 is formed on the pixel electrode 108 and a first electrode 106 and includes a via hole 111 located over the first electrode 106; an active layer 104 connected to the first electrode 106 through the via hole 111 of the passivation layer 109 and a second electrode 107 are formed on the passivation layer 109; a gate insulating layer 103 is formed on the active layer 104 and the second electrode 107; and a gate electrode 102 is formed on the gate insulating layer 103.

Methods of forming a pattern that includes a pixel electrode and a first electrode, a pattern of a passivation layer, and a pattern that includes an active layer and a second electrode in a manufacturing method of the top-gate array substrate are the same as those in steps 401 to 403 that have been described above in conjunction with FIG. 4, and details are omitted here. In addition, the manufacturing method may further include that, a gate insulating layer is formed on the pattern that includes the active layer and the second electrode, and then, a pattern including a gate electrode and a gate line is formed on the gate insulating layer, a pattern of a gate insulating layer is formed on the gate electrode and the gate line, and a gate electrode is formed on the gate insulating layer.

It is to be noted that, in the drawings, the size of layers and regions may be exaggerated for clarity of illustration. Also, it can be understood that when an element or a layer is referred to as being "on" another element or layer, it may be directly on the other element, or intervening layers may also be present. Furthermore, it can be understood that when an element or a layer is referred to as being "under" another element or layer, it may be directly under the other element, or one or more intervening layer(s) or element(s) may also be present. In addition, it also can be understood that when a layer or an element is referred to as being "between" two layers or two elements, it may be a unique layer between the two layers or the two elements, or one or more intervening layer(s) or element(s) may also be present. Similar reference numerals denote similar elements throughout this specification.

It can be understood that, the order in which operating steps of the manufacturing method disclosed by the present invention are performed is not limited to those described here, unless otherwise specifically mentioned. Therefore, the order in which operating steps of the manufacturing method disclosed by the invention are performed may be varied within the scope of the present invention, and results that are obvious to those ordinarily skilled in the related fields of the invention shall be deemed as being within the scope of the invention.

Descriptions made above are merely exemplary embodiments of the invention, but are not used to limit the protection scope of the invention. The protection scope of the invention is determined by attached claims.

This application claims the benefit of priority from Chinese patent application No. 201410234336.4, filed on May 29, 2014, the disclosure of which is incorporated herein in its entirety by reference as a part of the present application.

The invention claimed is:
1. An array substrate, comprising
   a pixel electrode, including a first portion located in a non-display region of the array substrate and a second portion located in a display region of the array substrate; a first electrode formed on the first portion of the pixel electrode;
   a passivation layer formed on the pixel electrode and the first electrode, the passivation layer including a via hole located over the first electrode; and an active layer and a second electrode that are formed on the passivation layer, the active layer being connected to the first electrode through the via hole of the passivation layer.

2. The array substrate according to claim 1, further comprising:
a common electrode, which lies on the passivation layer, and which is formed by a portion of the active layer located in the display region and subjected to a plasma treatment.

3. The array substrate according to claim 1, further comprising:
an etch barrier layer formed on the active layer and the second electrode.

4. The array substrate according to claim 1, further comprising:
a gate electrode and a gate line that are formed on a glass substrate; and
a gate insulating layer formed on the gate electrode and the gate line, with the pixel electrode formed on the gate insulating layer.

5. The array substrate according to claim 1, wherein:
the first electrode is a source electrode, the second electrode is a drain electrode; or, the first electrode is a drain electrode, and the second electrode is a source electrode.

6. The array substrate according to claim 4, wherein:
a material for the gate electrode, the first electrode and/or the second electrode is copper or a copper alloy.

7. The array substrate according to claim 1, wherein:
the second electrode does not overlap with the first electrode.

8. A display device, comprising the array substrate according to claim 1.

9. A manufacturing method of an array substrate, comprising:
forming a pattern that includes a pixel electrode and a first electrode, the pixel electrode including a first portion located in a non-display region of the array substrate and a second portion located in a display region of the array substrate, the first electrode being located on the first portion of the pixel electrode;
forming a pattern of a passivation layer on the pixel electrode and the first electrode, the passivation layer including a via hole located over the first electrode; and
forming a pattern that includes an active layer and a second electrode on the passivation layer, the active layer being connected to the first electrode through the via hole of the passivation layer.

10. The manufacturing method of the array substrate according to claim 9, further comprising:
conducting a plasma treatment on a portion of the active layer located in the display region, so as to form a common electrode.

11. The manufacturing method of the array substrate according to claim 9, further comprising:
forming a pattern of an etch barrier layer on the active layer and the second electrode.

12. The manufacturing method of the array substrate according to claim 9, further comprising:
forming a pattern that includes a gate electrode and a gate line on a glass substrate, forming a pattern of a gate insulating layer on the gate electrode and the gate line, and forming a pixel electrode on the gate insulating layer.

13. The manufacturing method of the array substrate according to claim 9, further comprising,
forming a transparent conductive layer thin film and a first electrode layer thin film in sequence;
coating a first photoresist on the first electrode layer thin film and subjecting it to exposure and development with a gray-tone mask, so as to form a first photoresist fully-retained region in correspondence with a first electrode zone to be formed, a first photoresist half-retained region in correspondence with a zone where the portion of the pixel electrode in the display region is to be formed, and a first photoresist fully-removed region in correspondence with other zone than those stated above;
conducting a first etching, so as to etch off the first electrode layer thin film and the transparent conductive layer thin film at the first photoresist fully-removed region, performing an ashing treatment on the first photoresist, so that the photoresist at the first photoresist fully-retained region is thinned, and the photoresist at the first photoresist half-retained region is fully removed, and then conducting a second etching, so as to etch off the first electrode layer thin film at the first photoresist half-retained region; and
removing the photoresist, so as to form a pattern that includes the pixel electrode and the first electrode.

14. The manufacturing method of the array substrate according to claim 9, further comprising,
forming an active layer thin film and a second electrode layer thin film in sequence on the passivation layer, wherein the active layer thin film forming a portion of the active layer located in the non-display region;
coating a second photoresist on the second electrode layer thin film and subjecting it to exposure and development with a gray-tone mask, so as to form a second photoresist fully-retained region in correspondence with a second electrode zone and a data line zone that are to be formed, a second photoresist half-retained region in correspondence with an active layer zone to be formed, and a second photoresist fully-removed region in correspondence with other zone than those stated above;
conducting a first etching, so as to etch off the second electrode layer thin film and the active layer thin film at the second photoresist fully-removed region, performing an ashing treatment on the second photoresist, so that the photoresist at the second photoresist fully-retained region is thinned, and the photoresist at the second photoresist half-retained region is fully removed, and then conducting a second etching, so as to etch off the second electrode layer thin film at the second photoresist half-retained region; and
removing the photoresist, so as to form a pattern that includes the second electrode, the data line and the active layer.

15. The manufacturing method of the array substrate according to claim 12, wherein,
a material for the gate electrode, the first electrode and/or the second electrode is copper or a copper alloy.

16. The manufacturing method of the array substrate according to claim 9, wherein,
the second electrode does not overlap with the first electrode.

17. The manufacturing method of the array substrate according to claim 9, wherein,
the first electrode is a source electrode, the second electrode is a drain electrode; or, the first electrode is a drain electrode, and the second electrode is a source electrode.

18. The display device according to claim 8, further comprising:
  a common electrode, which lies on the passivation layer, and which is formed by a portion of the active layer located in the display region and subjected to a plasma treatment.

19. The display device according to claim 8, further comprising:
  an etch barrier layer formed on the active layer and the second electrode.

20. The display device according to claim 8, further comprising:
  a gate electrode and a gate line that are formed on a glass substrate; and
  a gate insulating layer formed on the gate electrode and the gate line, with the pixel electrode formed on the gate insulating layer.

* * * * *